(12) United States Patent
Hong (10) Patent No.: US 6,310,482 B1
(45) Date of Patent: Oct. 30, 2001

(54) CAPACITANCE GAUGE TRACKING APPARATUS USED FOR EXPOSURE SYSTEM FOR MANUFACTURING SEMICONDUCTOR DEVICE, METHOD FOR THE TRACKING SURFACE OF SEMICONDUCTOR DEVICE USING THE SAME, LEVELING APPARATUS INCLUDING TRACKING APPARATUS, AND LEVELING METHOD (75) Inventor: Jin-seog Hong, Incheon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/324,918

(22) Filed: Jun. 3, 1999

(30) Foreign Application Priority Data

Jun. 12, 1998 (KR) .................................... 98-21970

(51) Int. Cl.[7] .................................... G01R 27/26

(52) U.S. Cl. .................... 324/681; 324/537; 324/661; 324/662

(58) Field of Search ..................... 324/681, 537, 324/548, 671, 691, 658, 661, 662, 158.1; 430/5

(56) References Cited

U.S. PATENT DOCUMENTS

| | | | |
|---|---|---|---|
| 3,975,680 | * | 8/1976 | Webb .................................. 324/61 R |
| 5,502,313 | * | 3/1996 | Nakamura et al. ............. 250/559.26 |
| 5,621,327 | * | 4/1997 | Chiang et al. ........................ 324/537 |
| 5,642,056 | * | 6/1997 | Nakajima et al. ................... 324/758 |

* cited by examiner

Primary Examiner—Vinh P. Nguyen
Assistant Examiner—Paresh Patel
(74) Attorney, Agent, or Firm—Law Offices of Eugene M Lee, P.L.L.C.

(57) ABSTRACT

A capacitance gauge tracking apparatus used for an exposure system for manufacturing a semiconductor device, a method for tracking a surface of the semiconductor device, a leveling apparatus and a leveling method are provided. The capacitance gauge tracking apparatus includes a ground unit, a probe unit and a gauge unit. The ground unit is connected to a semiconductor substrate. The probe unit is spaced apart from the surface of the semiconductor substrate to be tracked and a constant current of at least two frequency bands is applied to the probe unit. A constant current of a low frequency is applied to the probe unit to thereby perform global leveling by global tracking of the entire surface of the semiconductor substrate and a constant current of a high frequency is applied to the probe unit to thereby perform local leveling by local tracking on the semiconductor substrate.

9 Claims, 4 Drawing Sheets

CAPACITANCE GAUGE TRACKING APPARATUS USED FOR EXPOSURE SYSTEM FOR MANUFACTURING SEMICONDUCTOR DEVICE, METHOD FOR THE TRACKING SURFACE OF SEMICONDUCTOR DEVICE USING THE SAME, LEVELING APPARATUS INCLUDING TRACKING APPARATUS, AND LEVELING METHOD

BACKGROUND OF THE INVENTION

1. Field of the Invention

The present invention relates generally to an exposure system and more particularly to a capacitance gauge tracking apparatus used for an exposure system, a method for tracking a surface of a semiconductor device using the same, a leveling apparatus having a tracking apparatus and a leveling method, and to a semiconductor device made thereby.

2. Description of the Related Art

In a photolithography exposure system used in manufacturing of semiconductor devices, light beams are radiated on a photoresist layer overlying a semiconductor device substrate through a mask having predetermined transparent regions to expose predetermined regions in the photoresist layer. In order to form an accurate predetermined pattern in the photoresist during an exposure process, it is important to constantly control the exposure distance between the photoresist covered semiconductor device substrate and the light source of the exposure apparatus. The semiconductor device substrate should be leveled with respect to the light source by controlling the tilt degree and the position of the substrate mounted on a stage of the exposure system. That is, the focus distance between the substrate and the light source and/or the degree of tilt of the substrate should be controlled.

A prior art apparatus for leveling a substrate by controlling its focus distance or degree of tilt has a sub-unit for tracking the surface of the substrate to measure a distance between the surface of the substrate and the light source, such as an exposure slit. A capacitance gauge tracking apparatus that measures air capacitance (i.e., the capacitance between the probe and the substrate where the probe does not physically contact the substrate surface) may be used for tracking the surface of the semiconductor device substrate. In the capacitance gauge tracking apparatus, a probe tracks the surface of the substrate by being moved over the surface. A gauge measures a distance between the surface of the semiconductor device substrate and an exposure slit based on the signal from the probe. The measured signal from the gauge is fed back to an exposure system controller, such as a leveling apparatus stage controller. The controller positions a stage on which the substrate is mounted based on the measured signal. The photoresist layer on the semiconductor device substrate is then exposed by the light source of the exposure system.

Figure 1:
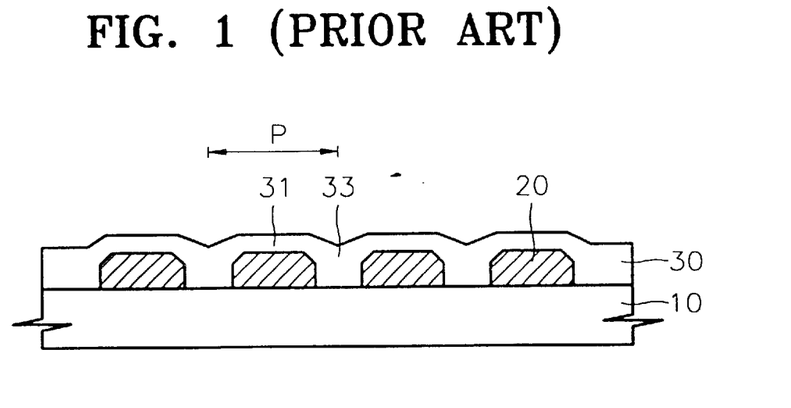
FIG. 1 is an elevational schematic sectional view showing a prior art vertical structure formed on a semiconductor device substrate.
Figure 2:
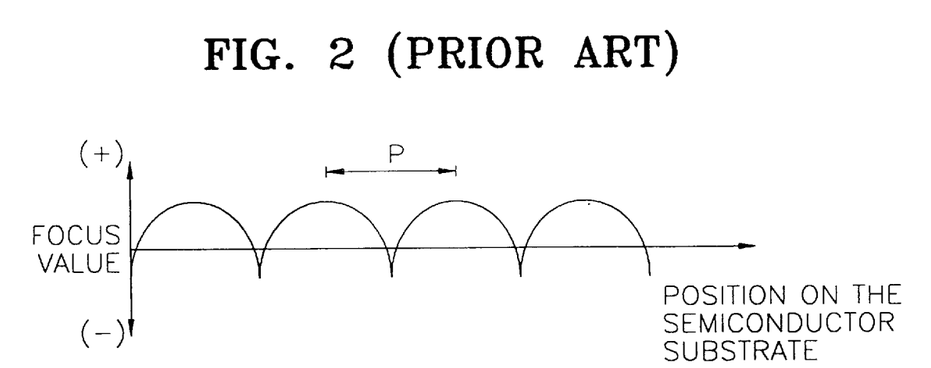
FIG. 2 is a graph schematically showing a focus value resulting from tracking a surface of the semiconductor device substrate of FIG. 1 using a prior art capacitance gauge tracking method.

FIG. 1 schematically shows a vertical structure formed on a semiconductor device substrate 10, and FIG. 2 schematically shows the result of tracking the surface of the semiconductor device substrate 10 using a capacitance gauge tracking apparatus.

Referring to FIG. 1, as the level of integration of semiconductor devices becomes higher, a step of a conductive layer 20, such as a storage node, becomes greater. That is, in order to ensure sufficient capacitance to operate a memory cell in a cell array area of the semiconductor device, a thick conductive layer 20, such as a doped polycrystalline silicon layer should be formed. A thick insulating layer 30 is required to overcome the large step of the thick conductive layer 20. However, the insulating layer 30 is relatively thin in a portion 31 covering the upper portion of the conductive layer 20, and relatively thick in a portion 33 burying the gap between the conductive layers 20 or in a portion covering a peripheral circuit area of the semiconductor device where the conductive layer 20 is not formed.

Referring to FIG. 2, when the surface of the semiconductor substrate is tracked by the capacitance gauge tracking apparatus, a measured value output by the apparatus oscillates in accordance with a position of the probe over the surface of the semiconductor substrate 10. The measured value may be a voltage value or a focus value (i.e., the measured voltage value converted by the apparatus to a distance between the substrate and the light source). That is, the focus value oscillates with a period (shown as "P", in FIGS. 1 and 2) corresponding to the period of oscillation in the thickness of the insulating layer 30.

Therefore, a change in the thickness of the insulating layer 30 can have an effect on the substrate position value, such as the focus value, measured by the capacitance gauge tracking apparatus. Although there is no substantial change in the height of the surface of the semiconductor substrate 10 covered by layers such as 20, 30, etc., the value measured by the capacitance gauge tracking apparatus may oscillate instead to indicate a substrate of a varying height of being relatively steady to indicate a substrate of a constant height. Thus, a tracking error is present in the signal output by the tracking apparatus to the stage controller. The signal output by the tracking apparatus erroneously indicates the state of the surface of the semiconductor substrate 10. The tracking error may cause the surface of the semiconductor substrate 10 to be misaligned with respect to the light source, such as the exposure slit of the exposure apparatus, by the stage controller of the leveling apparatus. That is, leveling failure or error may occur due to the tracking error. The leveling failure may greatly reduce a focus margin of the exposure process. The reduction in the focus margin may reduce an exposure process margin to generate an exposure failure which would lead to the eventual failure of the semiconductor device.

SUMMARY OF THE INVENTION

In view of the foregoing, it would be desirable to provide a capacitance gauge tracking apparatus and a leveling apparatus using the same, used for an exposure system for manufacturing a semiconductor device in which the tracking error can be reduced or prevented from being generated to suppress a reduction in a focus margin and leading to a more precise exposure system.

It would also be desirable to provide a method for tracking a surface of a semiconductor device and a method of leveling the semiconductor device in which a tracking error can be reduced or prevented from being generated to suppress reduction in a focus margin and leading to a more precise exposure process.

According to one embodiment of the present invention, there is provided a capacitance gauge tracking apparatus used for an exposure system for manufacturing a semiconductor device including a ground unit, a probe unit and a gauge unit.

The ground unit is electrically connected to a semiconductor device substrate. The probe unit is spaced apart from the semiconductor device substrate and receives a constant current of at least two different frequency bands to thereby track the surface of the semiconductor device substrate. The gauge unit measures the capacitance between the ground unit and the probe unit.

In a preferred aspect of this embodiment, the probe unit comprises at least one first probe to which a constant current of a first frequency is applied and at least one second probe to which a constant current of a second frequency is applied. The preferred constant current of the first frequency is approximately 50 Hz or less, and the preferred constant current of the second frequency is approximately 50~500 Hz.

According to another embodiment of the present invention, there is provided a leveling apparatus of an exposure system for manufacturing a semiconductor device including a stage, a stage driving unit, a ground unit, a probe unit, a gauge unit and a stage controller.

The stage is used for mounting a semiconductor device substrate. The stage driving unit is electrically connected to the stage and drives the stage to level the semiconductor device substrate. The ground unit is electrically connected to the semiconductor device substrate. The probe unit is spaced apart from the semiconductor device substrate and receives a constant current of at least two different frequency bands to thereby track the surface of the semiconductor device substrate. The gauge unit measures the capacitance between the ground unit and the probe unit. The stage controller is electrically connected to the gauge unit and the stage driving unit and controls the stage driving unit by a signal feeding back from the gauge unit.

In a preferred aspect of this embodiment, the probe unit comprises at least one first probe to which a constant current of a first frequency is applied and at least one second probe to which a constant current of a second frequency is applied. The preferred constant current of the first frequency is approximately 50 Hz or less, and the preferred constant current of the second frequency is approximately 50~500 Hz.

According to another embodiment of the present invention, a method for tracking a semiconductor device comprises introducing a semiconductor device substrate into a capacitance gauge tracking apparatus, applying a constant current of a first frequency to a probe of the tracking apparatus, measuring a capacitance or impedance between the probe and a ground connection in electrical contact with the semiconductor device substrate, applying a constant current of a second frequency higher than the first frequency to a probe of the tracking apparatus, and measuring a capacitance or impedance between the probe and a ground connection in electrical contact with the semiconductor device.

In one aspect of this embodiment, the semiconductor substrate is introduced to a capacitance gauge tracking apparatus used for an exposure system for manufacturing a semiconductor device including a ground unit, a probe unit and a gauge unit measuring capacitance between the ground unit and the probe unit. The probe units are spaced apart from a surface of the semiconductor substrate, and the constant current of a first frequency is applied to the probe unit to globally track the entire surface of the semiconductor substrate. The constant current of a second frequency higher than the first frequency is applied to the probe unit to locally track the surface of the semiconductor substrate.

In a preferred aspect of this embodiment, the probe unit comprises at least one first probe to which constant current of a first frequency is applied and at least one second probe to which constant current of a second frequency is applied. The preferred constant current of the first frequency is approximately 50 Hz or less, and the preferred constant current of the second frequency is approximately 50~500 Hz.

According to another embodiment of the present invention, a method of leveling a semiconductor device comprises placing a semiconductor device substrate on a stage, applying a constant current of a first frequency to a probe, measuring a capacitance or impedance between the probe and a ground connection in electrical contact with the semiconductor device substrate to globally track an entire surface of the semiconductor substrate, globally leveling the semiconductor device substrate based on the global tracking, applying a constant current of a second frequency higher than the first frequency to a probe, measuring a capacitance or impedance between the probe and a ground connection in electrical contact with the semiconductor device substrate to locally track the surface of the semiconductor substrate and locally leveling the semiconductor device substrate based on the local tracking.

In one aspect of this embodiment, a leveling apparatus of an exposure system for manufacturing a semiconductor device includes a stage where a ground unit of the capacitance gauge tracking apparatus is installed, a stage driving unit driving the stage and a stage controller controlling the stage driving unit. A semiconductor device substrate is introduced to the stage. The constant current of a first frequency is applied to a probe unit, to thereby globally track the entire surface of the semiconductor device substrate. The result of global tracking from the capacitance gauge tracking apparatus feeds back to the stage controller and the stage driving unit is driven by the stage controller to thereby perform global leveling. The constant current of a second frequency higher than a first frequency is applied to the probe unit to thereby locally track the surface of the semiconductor device substrate. The resulting signal of local tracking from the capacitance gauge tracking apparatus feeds back to the stage controller and the stage driving unit is driven by the stage controller to perform local leveling.

In a preferred aspect of this embodiment, the probe unit comprises at least one first probe to which constant current of a first frequency is applied and at least one second probe to which constant current of a second frequency is applied. The preferred constant current of the first frequency is approximately 50 Hz or less, and the preferred constant current of the second frequency is approximately 50~500 Hz.

According to another embodiment of the present invention, there is provided an apparatus for manufacturing a semiconductor device comprising ground means for electrical connection to a semiconductor device substrate, probe means for receiving a constant current of at least two different frequency bands to thereby track the surface of the semiconductor device substrate and gauge means for measuring the capacitance or impedance between the ground means and the probe means.

In a preferred aspect of this embodiment, the apparatus further comprises mounting means for mounting a semiconductor device substrate, driving means for driving the mounting means to level the semiconductor device substrate and control means for controlling the driving means by a signal feeding back from the gauge means.

According to another embodiment of the present invention, a method of tracking a semiconductor device comprises introducing a semiconductor device substrate into a capacitance gauge tracking apparatus, selecting a first value of a constant current frequency to be applied to a probe of the capacitance gauge tracking apparatus that is sufficient to avoid a tracking error due to variations in thickness or type of at least one insulating layer over the semiconductor device substrate, applying the constant current of the first frequency to the probe and measuring a capacitance or impedance between the probe and a ground connection in electrical contact with the semiconductor device.

According to the present invention, a tracking error can be prevented or reduced. Thus, when the exposure process is performed, a focus margin or a focus depth can be increased, and a more precise exposure process may thereby be realized.

BRIEF DESCRIPTION OF THE DRAWINGS

The above features and advantages of the invention will become apparent upon reference to the following detailed description of specific embodiments and the attached drawings, of which.

DESCRIPTION OF THE PREFERRED EMBODIMENTS

Korean application no. 98-21970 discloses the same subject matter as the present application and is hereby incorporated by reference as if fully set forth herein.

The present invention will now be described with respect to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 3:
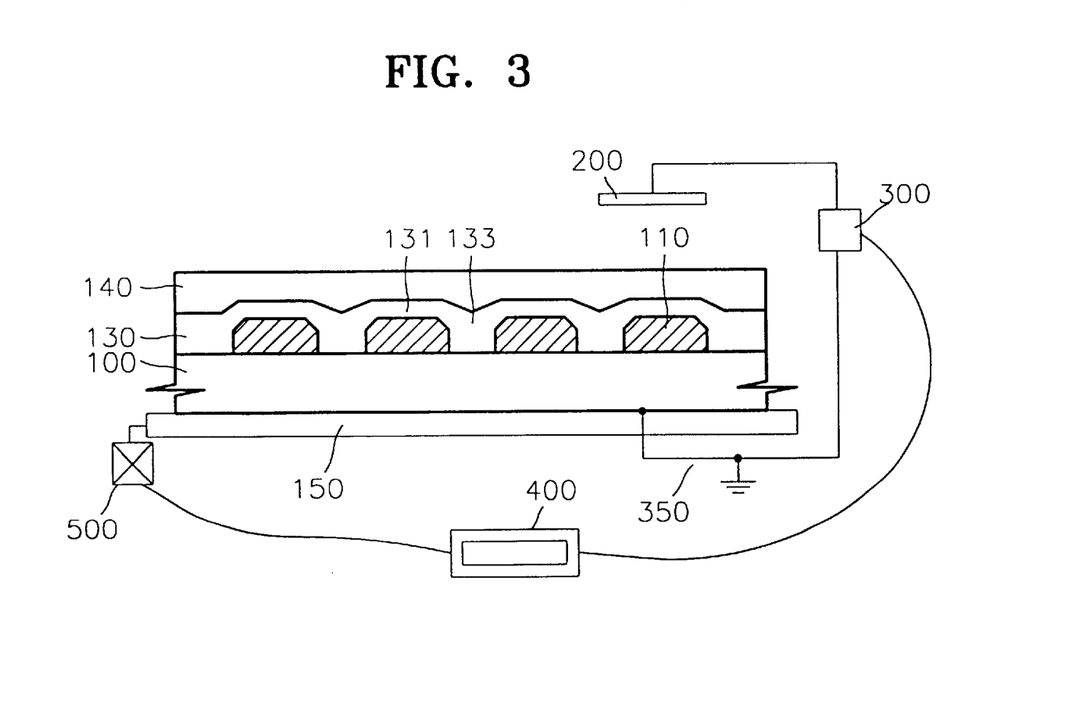
FIG. 3 is an elevational schematic sectional view showing a capacitance gauge tracking apparatus and a leveling apparatus according to an embodiment of the present invention.

Referring to FIG. 3, the capacitance gauge tracking apparatus according to an embodiment of the present invention includes a probe unit 200, a ground unit 350 and a gauge unit 300. The probe unit 200 comprises at least one probe. Preferably, the probe unit comprises a plurality of probes. The gauge unit 300 comprises a gauge that outputs a signal corresponding to a capacitance or impedance value measured by the probe unit 200. The signal output by the gauge unit 300 may be a voltage or a voltage converted to a focus or position value. The ground unit 350 comprises a ground wire or connection electrically connected to the gauge unit 300 and the semiconductor device substrate 100 (i.e., the ground unit 350 may be electrically connected to the substrate itself and/or to any overlying layer of the semiconductor device).

The semiconductor device substrate 100 may be a semiconductor substrate, such as silicon wafer or a compound semiconductor wafer (such as a GaAs wafer), a glass plate used to support thin film transistors in a liquid crystal display or any other material that may support a semiconductor or a solid state device. The in-process substrate 100 is shown at a stage where a process of coating a photoresist layer 140 has been performed. The substrate 100 contains a photoresist layer 140 over its top most layer, for example, such as an insulating layer 130. The semiconductor device substrate 100 having the photoresist layer 140 is mounted on a stage 150 of an exposure system.

The exposure system comprises an exposure apparatus and a leveling apparatus. The leveling apparatus is comprised of a capacitance gauge tracking apparatus as described above, a stage 150, a stage driving unit 500 and a stage controller 400. The stage driving unit 500 comprises a stage driving mechanism or a stage driver that moves the stage 150 in response to a command from the stage controller 400. Also, a light source (not shown) for radiating light beams towards the semiconductor device substrate 100 having a photoresist layer 140 is located above the stage 150 in a position facing the stage 150.

Preferably, the ground unit 350 is physically and electrically connected to the stage 150 so that the semiconductor device substrate 100 is electrically grounded. The ground unit 350 may alternatively be directly connected to the semiconductor device substrate 100 (i.e., the substrate itself or any layer of the overlying semiconductor device). Also, the probe unit 200 is suspended over the surface of the photoresist layer 140 formed over the substrate 100. The probe unit is separated from the photoresist layer 140 by a predetermined interval or space (i.e., air gap). Preferably, the probe unit 200 is installed or suspended in a position having the same height as the exposure slit of the light source of the exposure system to track the surface of the semiconductor substrate 100. The probe unit 200 and the ground unit 350 are electrically connected to the gauge unit 300.

The gauge unit 300 measures the capacitance between the probe unit 200 and the ground unit 350 with respect to the position of the probe unit 200 over the surface of the semiconductor device substrate 100, i.e., the capacitance between the semiconductor device substrate 100 and the probe(s) of the probe unit 200. The probe unit 200 is preferably positioned at the same height as the exposure slit of the light source, so that the measured capacitance can easily be transformed to a function of a distance between the light source and the semiconductor device substrate.

The measured capacitance is transformed to an impedance by the gauge unit 300 to be read from the gauge unit 300. Thus, the value measured between the probe unit 200 and the ground unit 350 may be considered as a capacitance or as an impedance value. The gauge unit 300 then transforms the impedance to an output (feedback) signal indicating a voltage value, which corresponds to a particular focus value (i.e., a value of the distance of the substrate 100 from the light source and the degree of tilt of the substrate). The gauge unit feeds the output (feedback) signal to the stage controller 400 of the leveling apparatus of the exposure system. The stage controller 400 controls the position or the tilt degree of the stage 150 based on the feedback signal by sending a control signal to the stage driving unit 500. Thus, the stage driving unit 500 drives or moves the stage 150 in accordance with the feedback signal from the gauge unit 300. The tilt degree or the position of the semiconductor device substrate 100 mounted on the stage 150 is controlled based on the tracking of the surface of the substrate 100 by the probe(s) of the probe unit 200.

Figure 4:
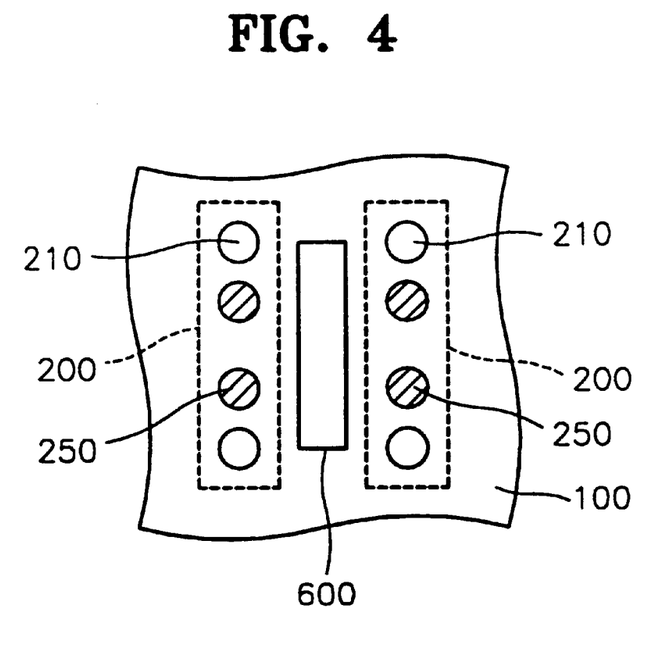
FIG. 4 is a top plan schematic view showing a probe of the capacitance gauge tracking apparatus according to an embodiment of the present invention.

Referring to FIG. 4, a constant current of at least two types of frequency bands or ranges is applied to the probe unit 200 according to an embodiment of the present invention. A constant current of a first frequency and a constant current of a second frequency having a frequency band higher than that of the first frequency can be independently applied to the probe unit 200. The scanning of the probe unit 200 with respect to the substrate 100 may take place by moving the probe unit 200, or by moving the stage 150 supporting the substrate or by moving both relative to each other. Element 600 is the exposure slit.

In an alternative aspect of the current invention, the two probe units 200 shown in FIG. 4 indicate that the tracking apparatus may contain two or more (i.e., plurality) probe units 200, each probe unit 200 comprising 1, 2, 3, 4 or more probes 210 and 250 that simultaneously measure the capacitance with respect to different portions of the substrate 100. The probes 210 and 250 are positioned around an exposure slit 600. A tracking apparatus containing a plurality of probe units requires little or no scanning movement of the probes with respect to the surface of the substrate 100 because a probe is positioned over different portions of the substrate 100 to cover the entirety of the substrate 100. The tracking method that requires little or no scanning of the probe unit(s) is advantageous because it takes less time to complete than a method requiring the scanning of the probe unit(s) over the substrate 100.

As shown in FIG. 4, the probe unit 200 preferably includes a pair of probes 210 and 250, such as needles and the like, to which constant current of each frequency band is independently applied. For instance, the constant current of the first frequency selected from a low frequency band or range may be applied to a first probe 210, and the constant current of the second frequency selected from a high frequency band or range may be applied to a second probe 250.

The probe unit may contain a plurality of first and second probe pairs 210 and 250. Probes 210 and 250 may be positioned separately in the probe unit 200 or adjacent to each other. Also, the number of each type of probes may be the same or different. For example, the probe unit 200 may contain four pairs of first probes 210 and second probes 250.

The gauge unit 300 usually measures capacitance or impedance between the probe unit 200 and the semiconductor substrate 100. The impedance is a function of a variable such as resistance, frequency and capacitance as shown in formula 1.

$$Z=[R^2+(1/(\omega C))^2]^{1/2} \quad (1)$$

In Formula 1, Z indicates impedance, R indicates resistivity per a unit area, i.e., $\rho/A$, C indicates capacitance proportional to $(\epsilon_1)A/d_1+(\epsilon_2)A/d_2+(\epsilon_3)A/d_3$. Here, $\epsilon_1$ indicates a relative dielectric constant of an insulating layer 130, $\epsilon_2$ indicates a dielectric constant of air, i.e., a dielectric constant of a space or interval between the probe unit 200 and the insulating layer 130, $\epsilon_3$ indicates the dielectric constant of the photoresist, A indicates a measured unit area, $d_1$ indicates the thickness of the insulating layer 130, $d_2$ indicates a distance between the probe unit 200 and a surface of the semiconductor substrate 100, i.e., a surface of the photoresist 140, and $d_3$ indicates the thickness of the photoresist 140. Also, $\omega$ indicates a frequency of constant current applied to the probe unit 200.

The gauge unit 300 transforms capacitance or impedance values measured by the probe unit 200 to their proportional voltage value signals. Also, the voltage value can be transformed to another signal, such as a focus value. Thus, a voltage value, a focus value, impedance, and/or capacitance are employed in the same intention or sense throughout the entire specification.

The voltage value or the focus value can be changed according to the thickness of the insulating layer 130 because they are changed according to a change of the impedance, since the relative dielectric constant $\epsilon_1$ of the insulating layer 130 is much higher than the dielectric constant $\epsilon_2$ of air or the dielectric constant $\epsilon_3$ of the photoresist 140. Therefore, the portion of the measured capacitance due to the insulating layer 130 is larger than the portion of the measured capacitance due to air or due to the photoresist 140. The measured capacitance due to the insulating layer 130 may be larger than the portion of the measured capacitance due to air by up to four times. Furthermore, the value of $d_1$ varies by a greater amount than the values of $d_2$ and $d_3$. Therefore, the variation in the value of capacitance, C, depends mainly on the variation in the thickness, $d_1$, of the insulating layer 130 and not on the variation in the values of the air gap, $d_2$, or the photoresist 140 thickness, $d_3$, and the variation in capacitance due to air or photoresist may be disregarded. Furthermore, the capacitance or resistance due to the conductive layer 110 formed on the semiconductor substrate 100 is low.

As a step height of the conductive layer 110, such as a storage electrode, increases, the thickness of the insulating layer 130 between the conductive layers 110 also increases. Therefore, a difference of the capacitance of regions 131 and 133 of the insulating layer 130 affect the measured value of the capacitance or impedance and the calculated value of the voltage or focus value. The difference in thickness of insulating regions 131 and 133 may cause the gauge unit to erroneously indicate that the substrate 100 is out of focus because it is tilted away from the light source or positioned too far or too near to the light source, when the substrate is actually in focus. Furthermore, the difference in thickness of insulating regions 131 and 133 may cause the gauge unit to erroneously indicate that the substrate is in focus, when the substrate is actually out of focus.

The photoresist layer 140 may be formed to a thickness of approximately 14,700 angstroms (1.47 $\mu$m), which is greater than the thickness of the conductive layer 110 or of the insulating layer 130, whose thickness may be approximately 5300 angstroms. Thus, there is little change of the capacitance or the impedance due to the photoresist layer 140 because the photoresist layer is much thicker than the insulating layer 130.

Even if the air capacitance is constant, the impedance measured in a portion 131 where the insulating layer 130 covers the conductive layer 110 and in a portion 133 where the insulating layer 130 buries a space between the conductive layers, can be different, so that the voltage values output by the gauge unit can be different. That is, even though a distance between the surface of the semiconductor substrate 100 and the probe 200 is constant, a different impedance may be measured due to the variable thickness of the insulating layer 130. Thus, the voltage value or the focus value measured in the gauge unit 300 may erroneously indicate an oscillating focus value according to a change in the thickness of the insulating layer 130 as shown in FIG. 2. This tracking error should be avoided.

Thus, in one embodiment of the present invention, a constant current selected from two different frequency bands or ranges is applied to the probe unit 200 to be tracked to avoid the tracking error. The applied constant current frequency is changed so that tracking can be performed by compensating for the change of the capacitance due to the variation in the thickness of the insulating layer 130. Thus, the variation in the measured capacitance or the impedance due to the change in thickness of the insulating layer can be suppressed. The voltage value or the focus value converted from the capacitance or the impedance is not influenced by the variation of the thickness of the insulating layer 130. Thus, the tracking error due to the variation of the thickness of the insulating layer 130 is suppressed by applying currents with two different frequencies to the probe unit 200.

In a preferred aspect of the present invention, the leveling apparatus of the exposure system performs both global and local leveling of the substrate 100 to bring it into focus with the light source. Global leveling involves controlling the tilt of the semiconductor substrate 100. In the global tracking required for the global leveling, the constant current of the first low frequency selected from a low frequency band or range is applied to the probe unit 200 (preferably to the first probe 210). The impedance, and hence the focus value, is sensitive to the variation of the measured capacitance when a constant current of a low frequency is applied to the probe unit 200. The stage 150 is controlled by the stage controller 400 based on the capacitance values measured during global tracking to primarily control the tilt degree of the semiconductor substrate 100. However, global leveling may also involve changing the vertical position of the stage 150 to bring the substrate 100 into focus.

Then, local leveling with respect to a region as small as a chip size is performed. In local tracking required for the local leveling, a constant current of the second, high frequency selected from a high frequency band or range is applied to the probe unit 200 (preferably to a second probe 250). The impedance, and hence the focus value, is not sensitive to the variation of the capacitance when a constant current of a high frequency is applied to the probe unit 200. The stage 150 is fine controlled according to the result of the local tracking to fine control the tilt and the position of the semiconductor substrate 100.

Global leveling contains little error due to the oscillations of the capacitance value over the length of a chip unit due to the changes in the insulating layer thickness because global leveling involves a large movement of the stage 150, while the tracking error due to the variations in the thickness of the insulating layer is responsible for a small error in the focus value (i.e., the measure of position). Therefore, the leveling error due to the tracking error is considered negligible in global tracking because the leveling error (measured in units of length) is very small compared to the large movement of the stage (also measured in units of length). The impedance and the voltage value or the focus value proportional to the measured capacitance also contain little error in global leveling. Thus, in the global leveling, the constant current of the first low frequency of a low frequency band may be applied to the probe unit 200 for global tracking. In global tracking, the measured capacitance and the focus value are sensitive to the change of the thickness of the insulating layer 130. A signal obtained by the global tracking feeds back to the stage controller 400 to realize leveling of the total semiconductor substrate 100.

Then, the local leveling is performed. Local leveling may be necessary in "step and repeat" exposure systems where different regions of the same photoresist layer are exposed sequentially. In step and repeat exposure systems, the wafer is moved relative to the light source, such as a narrow slit, to sequentially expose different regions on the substrate. A substrate may contain several roughly square chip regions, with each chip being sequentially, rather than simultaneously exposed by the exposure system. Therefore, local leveling may involve movement distances in the order of a chip size, as the substrate and/or the light source or mask are moved from one chip area on the substrate to the next chip area.

The local tracking required for the local leveling is influenced by the oscillations in the capacitance due to the variations in the thickness of the insulating layer 130 because the leveling error (measured in units of length) due to the tracking is comparable in size to the distance moved by the stage in local tracking. Therefore, the impedance and the voltage value or the focus value proportional to the capacitance are also influenced by the variations in the thickness of the insulating layer.

In local leveling, fine leveling is required. The focus value is sensitive to the changes in capacitance due to the tracking on the scale of a chip size unit, which may lead to a tracking error. That is, the change of the capacitance in accordance with the thickness of the insulating layer 130 may cause the tracking error. Therefore, the constant current of the second, high frequency selected from a high frequency band, is applied to the probe unit 200 (preferably to the second probe 250) to negate oscillations in the focus value because the focus value does not vary significantly with the variations in the thickness of the insulating layer 130 when the high frequency current is applied. Thus, signal output of the second probe unit 250 does not substantially react to the variations in the measured capacitance due to the change of the thickness of the insulating layer 130, so that the error of the voltage value or the focus value output by the gauge unit 300 can be suppressed. Thus, the tracking error can be suppressed.

The above effect is based on the correlations between the capacitance and the impedance, the resistance and the impedance, the impedance and the frequency and the impedance and the capacitance.

Figure 5:
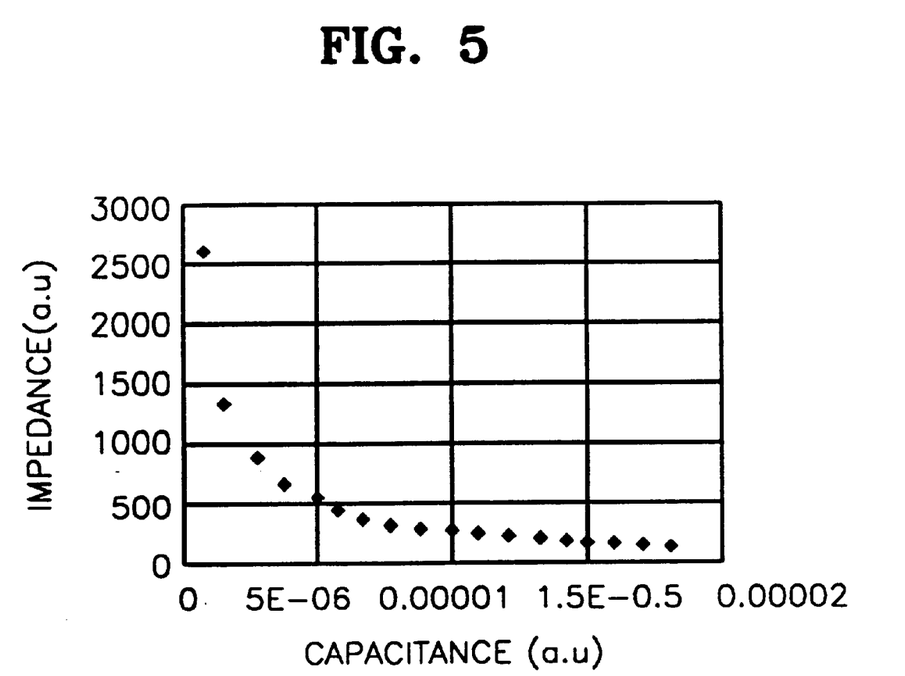
FIG. 5 is a graph showing a correlation between a capacitance to be measured by a capacitance gauge tracking apparatus of the present invention and a corresponding impedance.

Referring to FIG. 5, the capacitance is inversely proportional to the impedance, as may be seen from formula 1. Thus, the impedance is high in the low capacitance portion 131 of the insulating layer 130 covering the conductive layer 110. Conversely, the impedance is low in the high capacitance portion 133 of the insulating layer 130 burying the space between the conductive layers 110. As shown in formula 1, impedance varies inversely with the product of the capacitance and current frequency ($Z \sim 1/(C\omega)$). If the value of the frequency, ω, is small, then a change in capacitance, C, will affect the value of impedance, Z. Therefore, when a constant current of low frequency is applied to the probe unit, the measured impedance value and voltage value or the focus value oscillate due to a variation in the capacitance of the insulating layer 130, as shown in FIG. 2.

Figure 6:
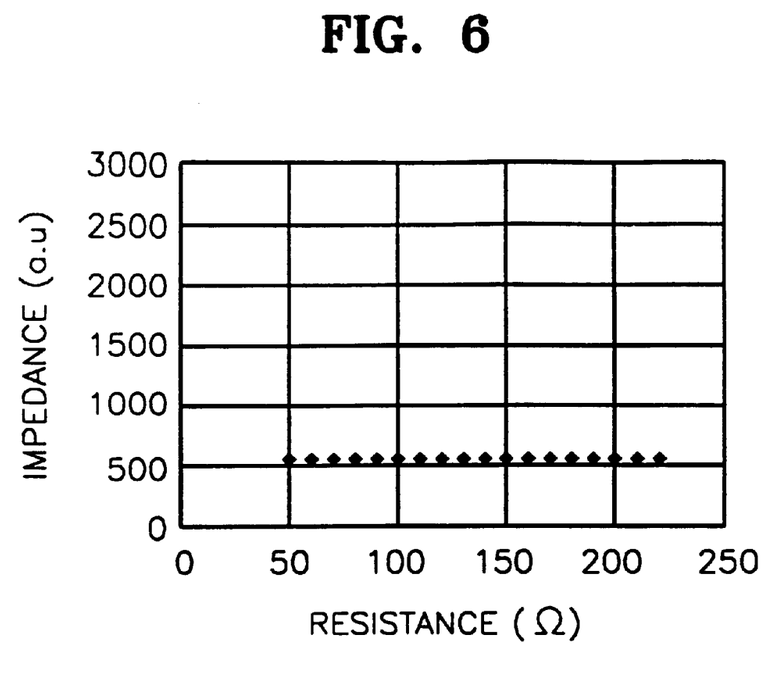
FIG. 6 is a graph showing a correlation between the resistance of a conductive layer and an impedance corresponding to a capacitance to be measured by a capacitance gauge tracking apparatus of the present invention.

Referring to FIG. 6, the impedance is not greatly influenced by the resistance value. Thus, the conductive layer 110 has little effect on the measured voltage value or focus value. Thus, the impedance is influenced by the change in the capacitance, not by a change in resistance.

Figure 7:
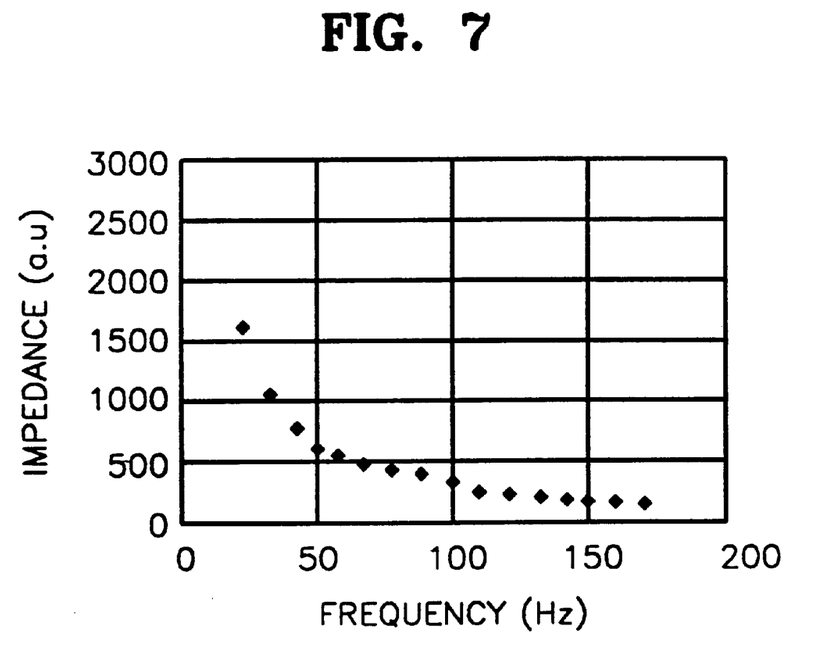
FIG. 7 is a graph showing a correlation between a constant current frequency to be applied to a capacitance gauge tracking apparatus of the present invention and an impedance corresponding to a capacitance to be measured by the capacitance gauge tracking apparatus of the present invention.

Referring to FIG. 7, impedance is inversely proportional to constant current frequency, as shown in formula 1 ($Z \sim 1/(C\omega)$). As shown in FIG. 7, the impedance is high for a constant current of the low frequency because as the frequency band is lower, the impedance value is affected by a change in the frequency. However, the measured impedance is not sensitive to changes in current frequency when the frequency value is high because the $1/(C\omega)$ term tends toward zero for all high values of frequency, ω. That is, as the frequency band of the constant current applied to the probe unit 200 is higher, i.e., the frequency is higher, the sensitivity of the impedance with respect to the frequency change is lower. The frequency of the constant current applied to the probe unit 200 is changed, so that the measured impedance and thus the sensitivity with respect to the capacitance can be controlled.

Figure 8:
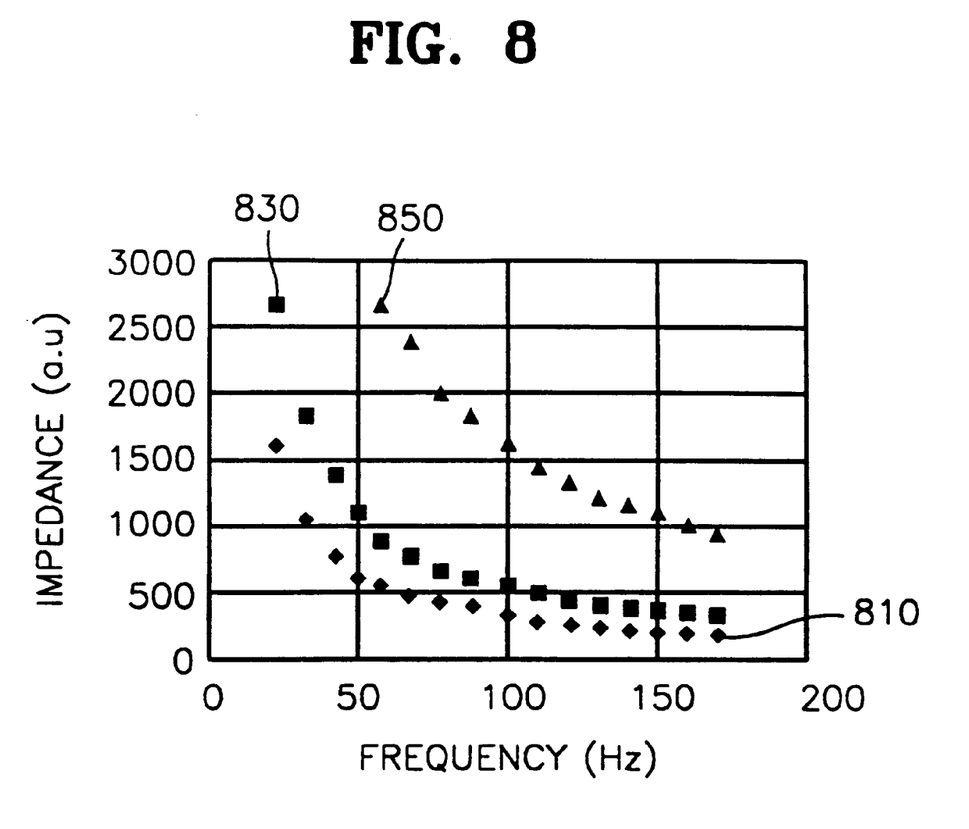
FIG. 8 is a graph showing a correlation between a constant current frequency to be applied to a capacitance gauge tracking apparatus of the present invention and an impedance corresponding to a capacitance to be measured by the capacitance gauge tracking apparatus of the present invention for various values of capacitance.

FIG. 8 shows the relationship between impedance and current frequency for various values of capacitance. In FIG. 8, the capacitances are assigned the following values in arbitrary units: $5 \times 10^{-6}$ (line 810), $3 \times 10^{-6}$ (line 830), and $1 \times 10^{-6}$ (line 850). The general correlation between the impedance and the frequency is the same as that shown in FIG. 7, regardless of the capacitance. As the capacitance increases, the changes of the impedance with respect to the frequency also increases. Also, as the capacitance increases, the impedance of a high frequency current still converges to a low value. Thus, when the capacitance is high, a constant current of high frequency is applied to the probe unit 200 to thereby suppress the contribution of the capacitance to the impedance.

For example, as shown in FIG. 8, the impedance increases by less than 100 arbitrary units when the capacitance is increased from $5 \times 10^{-6}$ (line 810) to $3 \times 10^{-6}$ (line 830) at a current frequency of 150 Hz. However, the impedance increases by about 1,000 arbitrary units when the capacitance is increased from $5 \times 10^{-6}$ (line 810) to $3 \times 10^{-6}$ (line 830) at a current frequency of 25 Hz. Furthermore, the impedance increases by less than 800 arbitrary units when the capacitance is increased from $5 \times 10^{-6}$ (line 810) to $1 \times 10^{-6}$ (line 850) at a current frequency of 150 Hz. However, the impedance would increase by more than 2,000 arbitrary units when the capacitance is increased from $5 \times 10^{-6}$ (line 810) to $1 \times 10^{-6}$ (line 850) at a current frequency of 25 Hz. Therefore, a high current frequency suppresses variations in impedance due to variations in capacitance.

Thus, the high frequency constant current applied to the probe unit 200 can suppress the change in impedance due to the variations in the insulating layer capacitance. As shown in Formula 1, a reciprocal number of the value obtained by multiplying the capacitance by the frequency contributes to the impedance ($Z \sim 1/(C\omega)$), so that when a constant current of a high frequency is applied to the probe unit 200, the frequency of Formula 1 is increased. The degree of the contribution to the value of the impedance due to the frequency is greater than the contribution of the capacitance when the frequency is high. As a result, the contribution of the capacitance to the impedance is reduced when the high frequency current is applied to the probe(s). Also, in the constant current of the high frequency, the change of the impedance in accordance with the change of frequency is suppressed. Thus, the change in the capacitance has little or no effect on the change in the impedance, so that the effect of variations of the capacitance on the impedance, and hence on the focus value can be suppressed.

Meanwhile, as shown in formula 1, for a low frequency current, the impedance value is mostly determined by the capacitance. Thus, when the constant current of the low frequency is applied to the probe unit 200, the measured impedance varies according to the variations of the measured capacitance.

According to another embodiment of the present invention, the local tracking required for the local leveling can be performed by applying the constant current of a high frequency to the probe unit 200, preferably through second probe(s) 250. Applying a high frequency current to the second probe 250 reduces the probe's sensitivity to the variations in the capacitance of the insulating layer 130. Thus, the measured impedance can be prevented from varying with the variations in the capacitance caused by the variation in the thickness of the insulating layer 130 changed by a chip size unit. That is, even when the height of the surface of the insulating layer 130 is equal while its thickness varies across the substrate 100, the tracking error due to the thickness variation of the insulating layer 130 can be reduced or prevented, to thereby perform more precise leveling.

Preferably, a constant current of a high frequency of approximately 50 Hz or more is applied to the probe unit 200. The impedance is converged to a low value when the frequency of approximately 50 Hz or more is applied as shown in FIGS. 7 or 8. More preferably, a constant current of a high frequency of approximately 50–500 Hz is applied to the probe unit 200, preferably the second probe(s) 250 to be tracked. A range of 150–500 Hz is most preferable. The tracked signal feeds back to the stage controller 400 as shown in FIG. 3. The stage controller 400 drives the stage driving unit 500 based on the signal, to thereby locally level the semiconductor device substrate 100. The semiconductor device substrate 100 can be more precisely leveled by local leveling based on local tracking. Thus, the focus margin can be improved.

Meanwhile, a constant current of a low frequency is applied to the probe unit 200, preferably the first probe(s) 210 to thereby perform global tracking for global leveling according to an embodiment of the present invention. As shown in FIGS. 7 and 8, the constant current of a low frequency of approximately 50 Hz or less can be applied. The contribution of the capacitance to the impedance in a low frequency band can be increased so that the impedance can be changed to a high value. Thus, the change of the impedance in accordance with the change of the capacitance can be measured with high sensitivity, which enables precise tracking.

Also, even though the impedance value is periodically changed, there is little or no problem when the leveling is performed with respect to the entire semiconductor device substrate 100. The signal obtained by performing the above process feeds back to the stage controller 400 as shown in FIG. 3. The stage controller 400 drives the stage driving unit 500 based on the signal, to thereby perform the global leveling on the semiconductor substrate 100.

A constant current of a different frequency band can be applied to the first and the second probe(s) 210 and 250, to thereby sequentially perform the global tracking or the global leveling and the local tracking or the local leveling.

According to the present invention, the constant current of frequency bands of two types or more is applied to the probe unit to perform the global tracking and the local tracking, so that the tracking error according to the change in the thickness of the insulating layer can be suppressed. Thus, the global leveling and the local leveling are performed to thereby suppress the leveling failure. An improved focus margin, a focus depth or an exposure margin can be obtained and a more precise exposure process can be realized.

While suppression of the tracking and leveling error has been described with respect to the semiconductor device in which the thickness of an insulating layer varies along the surface of the device, the present invention also allows the reduction or suppression of tracking and leveling error due to the variations in the type of insulating layer overlying the semiconductor device substrate. The capacitance of different insulating layers differs due to their different dielectric constants. Therefore, when a first portion of the semiconductor device substrate is covered by a first insulating layer (i.e., silicon oxide), while a second portion of the semiconductor device substrate is covered by a different, second insulating layer (i.e., silicon nitride) of the same height as the first insulating layer, the capacitance of the first portion may be different from the capacitance of the second portion, despite the same height of the insulating layers. By applying a high current frequency during local tracking, a tracking error due to the variation in the capacitance of the different insulating layers may be reduced or avoided.

In an alternative embodiment of the present invention, the value of the current frequency applied to the probe unit of an exposure system is selected to avoid the tracking error due to the variations in thickness of one or more insulating layers over a semiconductor device substrate. Different insulating layers, such as silicon nitride and silicon oxide have different dielectric constants and hence different capacitance values. Furthermore, different semiconductor devices require insulating layers of different thickness. Therefore, the value of the probe current frequency is determined based on the number of insulating layers overlying the semiconductor device to be tracked and leveled, the thickness variations expected in each insulating layer and the type of insulating layer(s) present over the semiconductor device. The current of the selected frequency is then applied to the probe unit 200 to track the surface of the semiconductor device The probe unit signal is then fed to the gauge unit 300. The controller 400 and driving unit 500 then position and level the stage based on the focus or voltage value output by the gauge unit 300, as shown in FIG. 3. It is preferred that the current of the selected frequency value is applied during local tracking used for local leveling which follows global tracking and leveling. However, the current of the selected frequency may be applied even during global tracking and leveling. Furthermore, in some such exposure processes, local tracking and leveling may not be needed and may thus be omitted. Preferably, the selected current is 100 Hz and above, more preferably 150 to 500 Hz.

The tracking and leveling apparatuses and methods of the current invention may be used for the manufacture of any semiconductor or solid state device. These devices include, but are not limited to memory devices, such as DRAMs, logic devices, such as microprocessors, control circuits, ASICs, mixed digital/analog circuits, TFTs, photosensitive devices, semiconductor lasers and semiconductor diodes.

In the drawings and specification, there have been disclosed typical preferred embodiments of the invention and, although specific terms are employed, they are used in a generic and descriptive sense only and not for purposes of limitation or the scope of the invention being set forth in the following claims. Thus, many changes and modifications can be made within the scope of the invention by a person skilled in the art.

Thus, an apparatus and method have been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A leveling apparatus for an exposure system for manufacturing a semiconductor device comprising:

a stage for mounting a semiconductor device substrate;

a stage driving unit electrically connected to the stage and driving the stage to level the semiconductor device substrate;

a ground unit electrically connected to the semiconductor device substrate;

a probe unit spaced apart from the semiconductor device substrate, and receiving a constant current of at least two different frequency bands to thereby track the surface of the semiconductor device substrate;

a gauge unit measuring a capacitance or impedance between the ground unit and the probe unit; and a stage controller electrically connected to the gauge unit and the stage driving unit, and controlling the stage driving unit by a signal feeding back from the gauge unit.

2. The leveling apparatus of claim 1, wherein the probe unit comprises at least one first probe to which the constant current of a first frequency is applied and at least one a second probe to which the constant current of a second frequency is applied.

3. The leveling apparatus of claim 2, wherein the constant current of the first frequency is approximately 50 Hz or less.

4. The leveling apparatus of claim 2, wherein the constant current of the second frequency is approximately 50–500 Hz.

5. A leveling method of a semiconductor device, comprising the steps of:

placing a semiconductor device substrate on a stage;

applying a constant current of a first frequency to a probe;

measuring a capacitance or impedance between the probe and a ground connection in electrical contact with the semiconductor device substrate to globally track an entire surface of the semiconductor device substrate;

globally leveling the semiconductor device substrate based on the global tracking;

applying a constant current of a second frequency higher than the first frequency to a probe;

measuring a capacitance or impedance between the probe and a ground connection in electrical contact with the semiconductor device substrate to locally track the surface of the semiconductor device substrate; and locally leveling the semiconductor device substrate based on the local tracking.

6. The leveling method of claim 5, wherein the constant current of the first frequency is applied to at least one first probe and the constant current of the second frequency is applied to at least one second probe different from the at least one first probe.

7. The leveling method of claim 5, wherein the constant current of the first frequency is approximately 50 Hz.

8. The leveling method of claim 5, wherein the constant current of the second frequency is approximately 5~500 Hz.

9. The leveling method of claim 5, wherein:

the step of applying a constant current of a first frequency comprises applying the constant current to the probe over multiple regions of the surface of the semiconductor device substrate;

local tracking comprises tracking in a region the size of a chip formed on the semiconductor device substrate; and the step of local leveling is preformed in a region the size of a chip formed on the semiconductor device substrate.

* * * * *